United States Patent
Sulistyanto et al.

(10) Patent No.: US 9,076,862 B2
(45) Date of Patent: *Jul. 7, 2015

(54) SEMICONDUCTOR DEVICE AND METHOD FOR FABRICATING THE SAME

(71) Applicant: Vanguard International Semiconductor Corporation, Hsinchu (TW)

(72) Inventors: Priyono Tri Sulistyanto, Yogyakarta (ID); Rudy Octavius Sihombing, Medan (ID); Chia-Hao Lee, New Taipei (TW); Shang-Hui Tu, Jhubei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 14 days.

This patent is subject to a terminal disclaimer.

(21) Appl. No.: 13/758,076

(22) Filed: Feb. 4, 2013

(65) Prior Publication Data

US 2014/0217501 A1    Aug. 7, 2014

(51) Int. Cl.
*H01L 29/78* (2006.01)
*H01L 29/66* (2006.01)

(52) U.S. Cl.
CPC ...... *H01L 29/7816* (2013.01); *H01L 29/66681* (2013.01)

(58) Field of Classification Search
CPC .............. H01L 29/063; H01L 29/0634; H01L 29/7835; H01L 29/7801; H01L 29/7816; H01L 29/66681
USPC .......................................... 257/343, 492, 493
See application file for complete search history.

(56) References Cited

U.S. PATENT DOCUMENTS

| | | | |
|---|---|---|---|
| 7,629,631 B2 | 12/2009 | Yilmaz | |
| 8,704,300 B1 * | 4/2014 | Lin et al. | 257/335 |
| 2008/0029814 A1 * | 2/2008 | Khalil | 257/339 |
| 2011/0089492 A1 * | 4/2011 | Yilmaz | 257/343 |
| 2014/0124856 A1 * | 5/2014 | LIN et al. | 257/335 |
| 2014/0217501 A1 | 8/2014 | Sulistyanto et al. | |

* cited by examiner

*Primary Examiner* — Tucker Wright
(74) *Attorney, Agent, or Firm* — Birch, Stewart, Kolasch & Birch, LLP

(57) ABSTRACT

The invention provides a semiconductor device, including: a substrate having a first conductivity type, including: a body region having the first conductivity type; a source region formed in the body region; a drift region having a second conductivity type adjacent to the body region; and a drain region formed in the drift region; a multiple reduced surface field (RESURF) structure embedded in the drift region of the substrate; and a gate dielectric layer formed over the substrate; wherein the first conductivity type is opposite to the second conductivity type.

24 Claims, 14 Drawing Sheets

SEMICONDUCTOR DEVICE AND METHOD FOR FABRICATING THE SAME

BACKGROUND OF THE INVENTION

1. Field of the Invention

The present invention relates to a semiconductor device, and in particular, relates to a semiconductor device having a high voltage MOSFET with very low on-resistance and method for fabricating the same.

2. Description of the Related Art

Bipolar-CMOS-LDMOSs (BCDs) have been widely used in power management integrated circuit (PMIC) applications. BCD technology integrates bipolar, complementary metal-oxide-semiconductor (CMOS) and laterally diffused metal-oxide-semiconductor (LDMOS) technology into one chip. In a BCD device, a bipolar device is used to drive high currents, a CMOS provides low power consumption for digital circuits, and a LDMOS device provides high voltage (HV) handling capabilities.

LDMOS devices are widely used in day to-day applications. On-resistance is an important factor that is directly proportional to the power consumption of an LDMOS device. As the demand for power savings and better performance of electronic devices increase, manufacturers have continuously sought to reduce the leakage and on-resistance ($R_{on}$) of LDMOS devices. However, the reduction of on-resistance is closely related to the high off-state breakdown voltage. Specifically, reducing the on-resistance leads to a substantial drop of the high off-state breakdown voltage. Thus, a conventional LDMOS device is able to deliver a high off-state breakdown voltage but fails to provide low on-resistance.

An LDMOS device includes a drift region, and a body region. It has been observed that the on-resistance of the conventional LDMOS device decreases when the dopant concentration of the drift region increases. However, the high off-state breakdown voltage of the LDMOS decreases as the doping concentration increases.

Thus, an improved semiconductor device and a method for fabricating the same are needed.

BRIEF SUMMARY OF THE INVENTION

An exemplary embodiment of a semiconductor device includes: semiconductor device, comprising: a substrate having a first conductivity type, comprising: a body region having the first conductivity type; a source region formed in the body region; a drift region having a second conductivity type adjacent to the body region; and a drain region formed in the drift region; a multiple reduced surface field (RESURF) structure embedded in the drift region of the substrate; and a gate dielectric layer formed over the substrate; wherein the first conductivity type is opposite to the second conductivity type.

Another exemplary embodiment, wherein the body and drift regions are formed in an epitaxial layer of the substrate and the gate dielectric layer is formed over the epitaxial layer of the substrate.

An exemplary embodiment of a method for fabricating a semiconductor device includes: providing a semiconductor substrate of a first conductivity type; implanting a dopant of a first conductivity type into the substrate to define a body region; implanting a dopant of a second conductivity type, into the substrate to define a drift region adjacent to the body region; forming a multiple reduced surface field (RESURF) structure in the drift region; forming a gate dielectric layer over the substrate; forming a source region in the body region; and forming a drain region in the drift region; wherein the first conductivity type is opposite to the second conductivity type.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 5a-5e illustrate schematic views showing a LDMOS device in accordance with embodiments of the present disclosure;

DETAILED DESCRIPTION OF THE INVENTION

Figure 1:
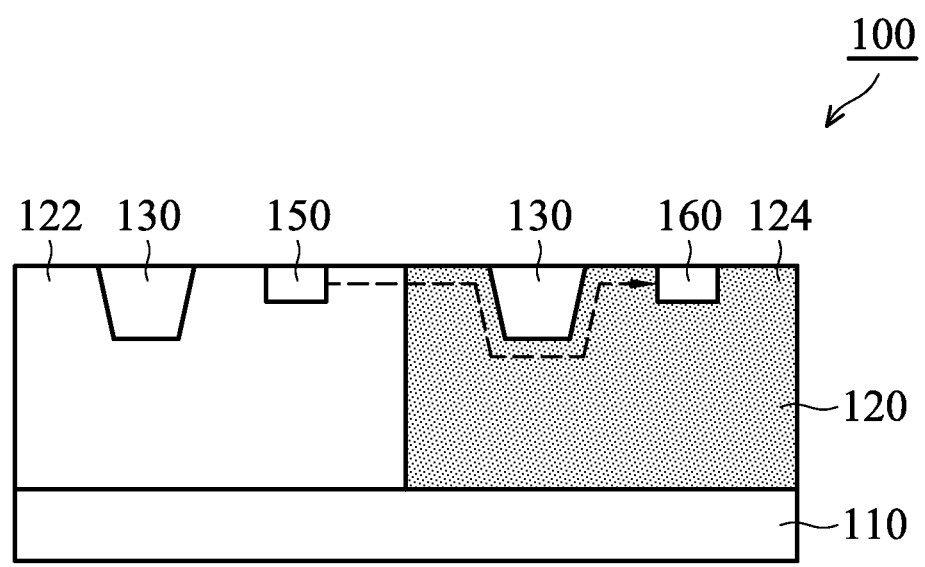
FIG. 1 is cross-sectional view of a conventional LDMOS device.

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Referring to FIG. 1, a cross-sectional view of a conventional LDMOS device 100 is illustrated. The LDMOS device 100 comprises a substrate 110 having, a body region 122 and a drift region 124 formed in the substrate 110. The substrate 110 further comprises a plurality of shallow trench isolations (STIs) 130 formed therein. In the LDMOS device 100, the current from the source region 150 to the drain region 160 flows by a devious path as shown as the dotted line in FIG. 1 due to the obstruction of the STI 130 in between the source and drain regions 150, 160. The deviation of the current path results in a high on-resistance of the LDMOS device 100.

FIGS. 2a-5e illustrate a step-by-step procedure for fabricating a semiconductor device 200 in accordance with embodiments of the present disclosure.

Figure 2A:
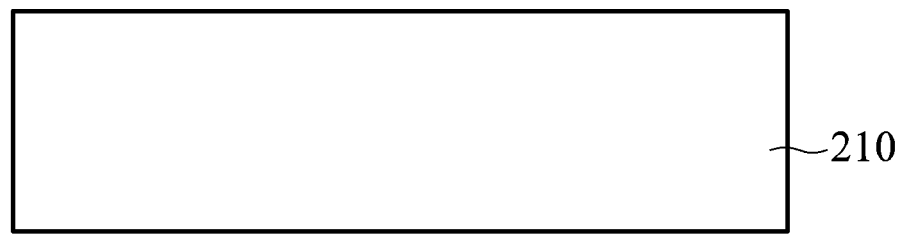
FIG. 2a-2c are schematic views showing a LDMOS device in accordance with embodiments of the present disclosure.

FIGS. 2a-2d illustrate the formation of a body region and a drift region of the semiconductor device 200 in accordance with an embodiments of the present disclosure. Referring to FIG. 2a, a substrate 210 having a first conductivity type is provided. The substrate 210 may be a bulk silicon substrate, a silicon-on-insulator (SOI) substrate, or the like. In some embodiments, the substrate 210 may have a first conductivity type of p-type, such as a boron doped substrate. In other embodiments, the substrate 210 may have a first conductivity type of n-type, such as a phosphor or arsenic substrate. Any other suitable substrates may also be used.

Figure 2B:
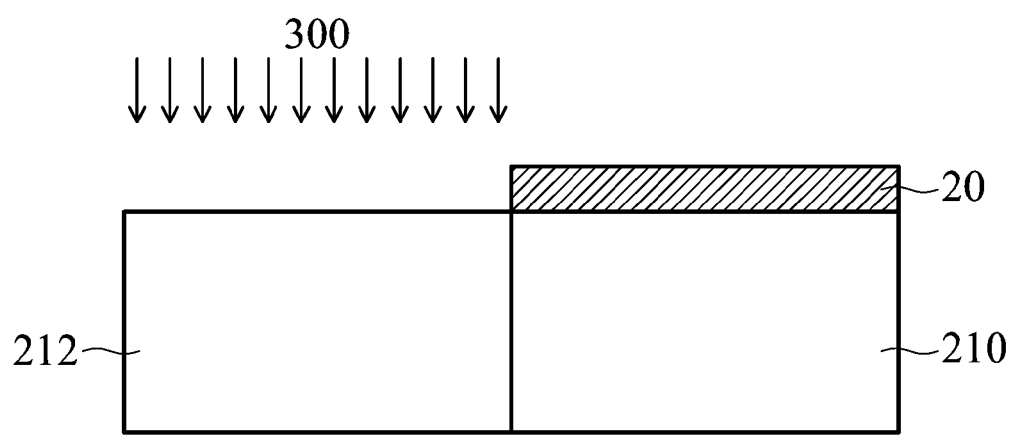

Referring to FIG. 2b, a mask layer 20 is formed over the substrate 210. The mask layer 20 may be a patterned photoresist layer or a hard mask layer such as a silicon nitride or a silicon oxynitride layer or the like. After the mask layer 20 is formed, a doping process 300 is performed to selectively dope a dopant of a first conductivity type, into the semiconductor substrate 210 to define a body region 212. In some exemplary embodiments, the concentration of the substrate 210 may be greater than that of the body region 212. For example, when the body region 212 is p-type, the substrate 210 may be heavily doped p-type (P+). The mask layer 20 is then removed after the body region 212 is formed.

Figure 2C:
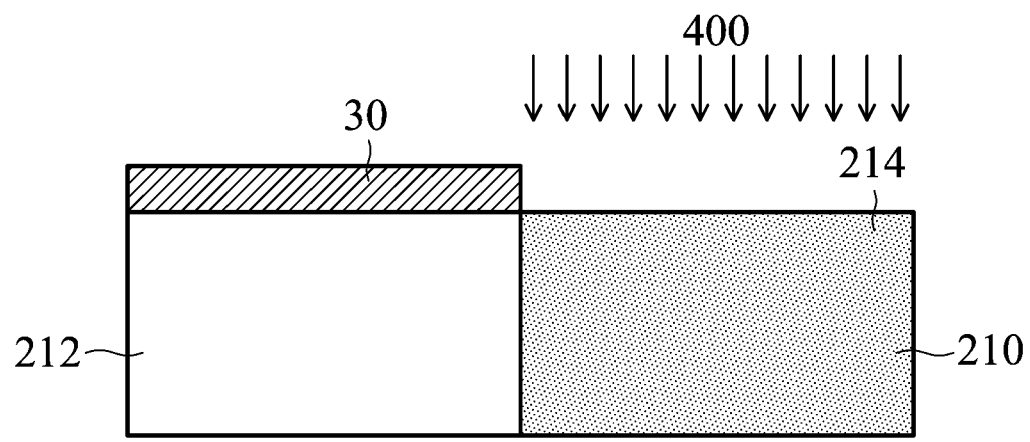

Referring to FIG. 2c, another mask layer 30 is formed over the substrate 210. The mask layer 30 may be a patterned photoresist layer or a hard mask layer such as a silicon nitride or a silicon oxynitride layer or the like. A doping process 400 is performed to selectively dope a dopant of a second conductivity type, into the semiconductor substrate 210 to define a drift region 214. In some embodiments, the second conductivity type is different from the first conductivity type.

In some embodiments, the drift region 214 may be a wide area formed prior to the formation of the body region 212. After the drift region 214 is formed, the body region 212 is formed in the drift region by an implantation process, as shown as FIG. 3a.

Figure 3A:
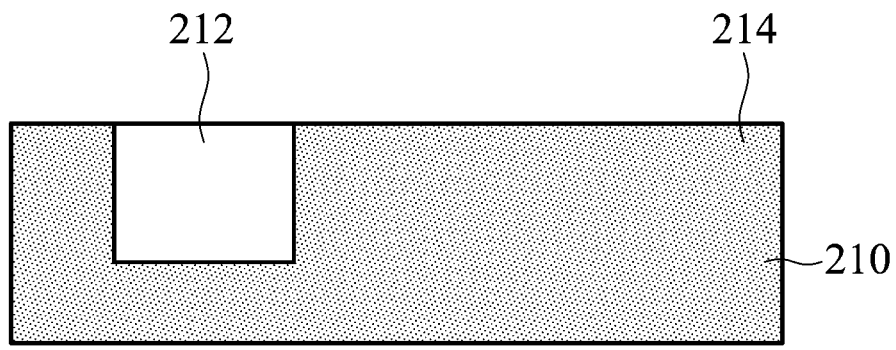
FIG. 3a-3b illustrate a method for forming a LDMOS device in accordance with embodiments of the present disclosure.
Figure 3B:
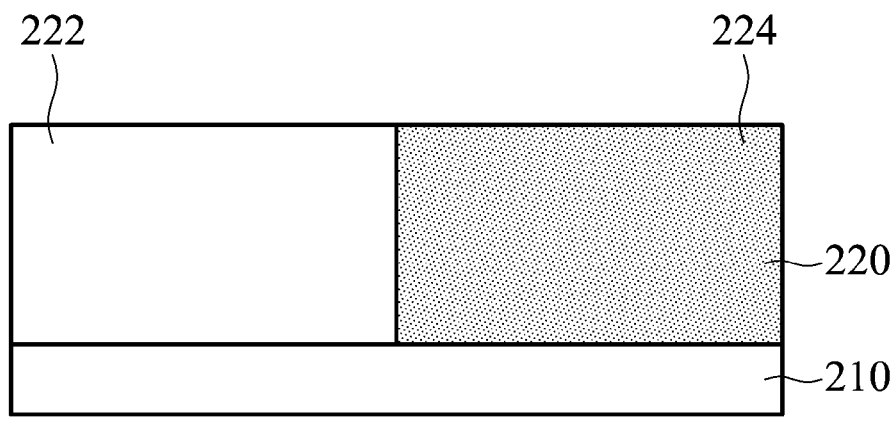

In some embodiments, an epitaxial layer may be optionally formed over the substrate 210 and the body and drift regions are formed in the epitaxial. Referring to FIG. 3b, an epitaxial layer 220 of the first conductivity type is formed on the substrate 210. Moreover, the semiconductor substrate 210 has a doping concentration larger than that of the epitaxial layer 220. For example, when the first conductivity type is n-type, the semiconductor substrate 210 may be a heavily doped n-type (N+) semiconductor substrate 210, while the epitaxial layer 220 may be a lightly doped n-type (N−) epitaxial layer. The epitaxial layer 220 may be formed by epitaxial growth to a thickness ranging from 3 um to 10 um. In such embodiments, the body region 222 and the drift region 224 are form in the epitaxial layer 220. The formation body and drift regions 222 and 224 is similar to that of the body and drift regions 212 and 214, and hence is not discussed herein to avoid repetition.

After the body region 222 and the drift region 224 are formed, a procedure for forming a multiple reduced surface field (RESURF) structure, is then performed.

Figure 4A:
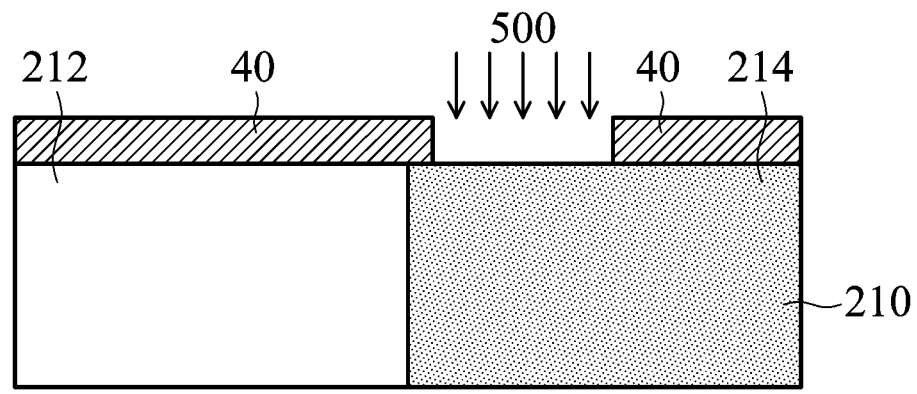
FIG. 4a-4b illustrate a method for forming a multiple reduced surface field (RESURF) structure of a LDMOS device in accordance with embodiments of the present disclosure.
Figure 4B:
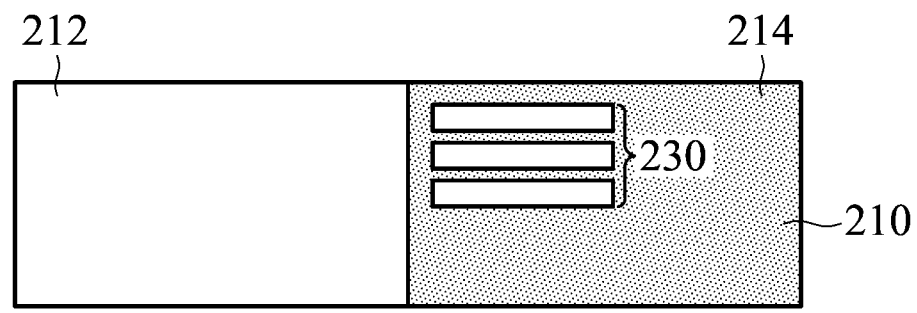

FIGS. 4a-4b illustrate the formation of a multiple reduced surface field (RESURF) structure, in accordance with various embodiments of the present disclosure. Referring to FIG. 3a, a mask layer 40 is formed on the semiconductor substrate 210 (or the epitaxial layer 220 if exists) to expose an area to be defined as the multiple RESURF region. The mask layer 40 may be a patterned photoresist layer or a hard mask layer such as a silicon nitride or a silicon oxynitride layer or the like. A plurality of ion implantation processes 500 is then performed to form a multiple RESURF structure 230. In some embodiments, the RESURF structure 230 is formed in the drift region 214 (or 224) Referring to FIG. 4b, after the multiple RESURF structure is formed, the mask layer 40 is removed and an annealing process is performed to activate the implanted ions.

Figure 5A:
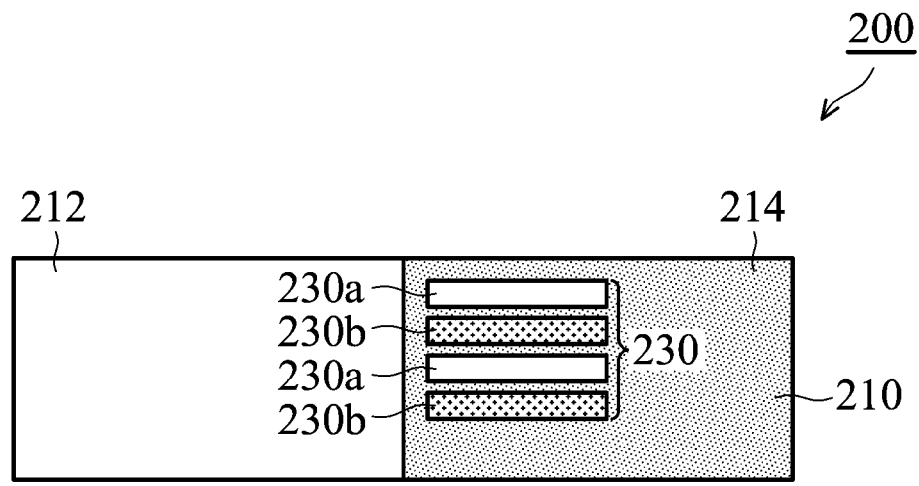
FIG. 5a-5h illustrate various configurations of a LDMOS device with a RESURF structure in accordance with different embodiments of the present disclosure.

Various configurations of the RESURF structure 230 are illustrated in FIGS. 5a-5h in accordance with exemplary embodiments of the present disclosure. Referring to FIG. 5a, a cross-sectional view of the RESURF structure 230 is illustrated in accordance with an exemplary embodiment of the present disclosure. The RESURF structure 230 is a multi-layered consisting of a plurality of first ion regions 230a and a plurality of second ion regions 230b. The RESURF structure 230 is configured alternately, with the plurality of first ion regions 230a and the plurality of second ion regions 230b in a vertical direction. The conductivity types of the first and the second ion regions 230a and 230b are different from each other. In the embodiment, the conductivity type of the plurality of first ion regions 230a is the first conductivity type corresponding to the body region 222 and the conductivity type of the plurality of second ion regions 230b is the second conductivity type corresponding to the drift region 214. In another embodiment, the conductivity type of the plurality of first ion regions 230a is the second conductivity type and the conductivity type of the plurality of second ion regions 230b is the first conductivity type.

Figure 5B:
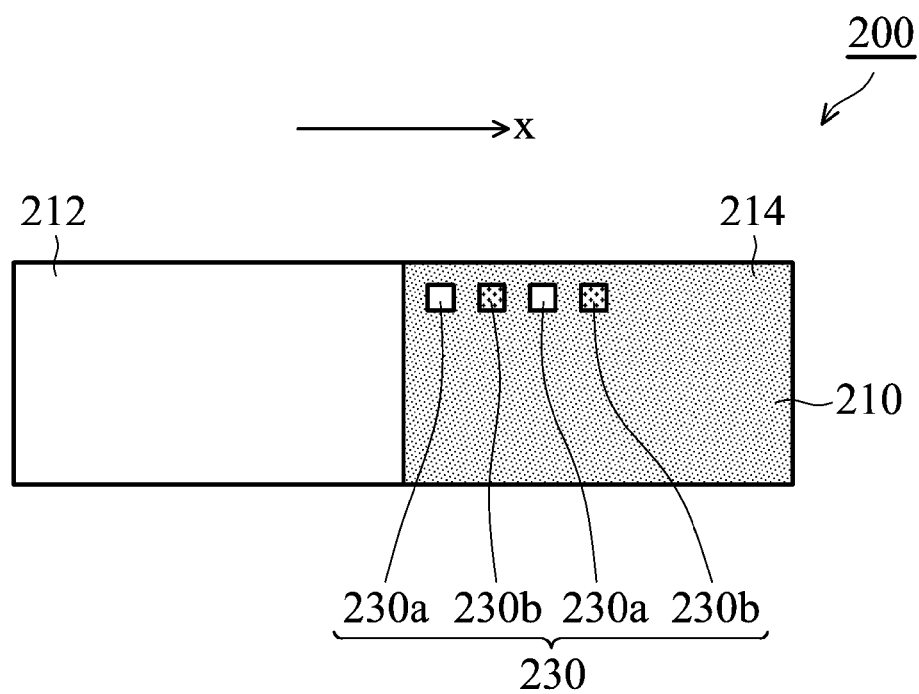

A cross-sectional view of the RESURF structure 230 in accordance with another exemplary embodiment of the present disclosure is illustrated in FIG. 5b. Referring to FIG. 4b, the RESURF structure 230 is a multi-layered structure consisting of a plurality of first ion regions 230a of the first conductivity type and a plurality of second ion regions 230b of the second conductivity type. The RESURF structure 230 is configured by alternating the plurality of first ion regions 230a and the plurality of second ion regions 230b in a first lateral direction x. The conductivity types of the first and the second ion regions 230a and 230b are different from each other. In the embodiment, the conductivity type of the plurality of first ion regions 230a is the first conductivity type corresponding to the body region 212 and the conductivity type of the plurality of second ion regions 230b is the second conductivity type corresponding to the drift region 214. In another embodiment, the conductivity type of the plurality of first ion regions 230a is the second conductivity type and the conductivity type of the plurality of second ion regions 230b is the first conductivity type.

Figure 5C:
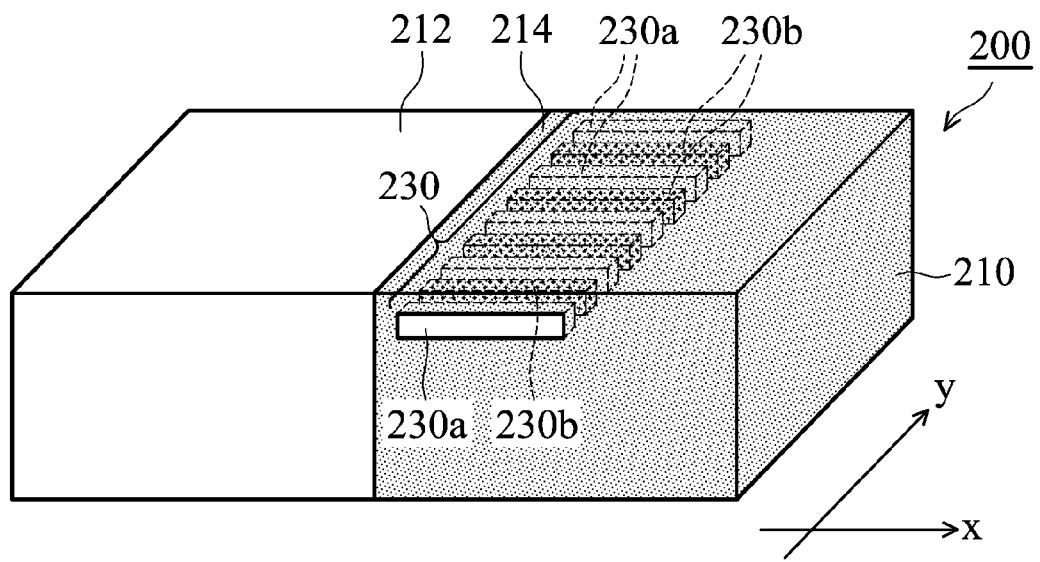

Referring to FIG. 5c, a 3-dimensional perspective view of the RESURF structure 230 is illustrated in accordance with yet another exemplary embodiment of the present disclosure. The RESURF structure 230 is a multi-layered structure consisting of a plurality of first ion regions 230a and a plurality of second ion regions 230b. The RESURF structure 230 is configured by alternating the plurality of first ion regions 230a and the plurality of second ion regions 230b in a second lateral direction y. The conductivity types of the first and the second ion regions 230a and 230b are different from each other. In the embodiment, the conductivity type of the plurality of first ion regions 230a is the first conductivity type corresponding to the body region 212 and the conductivity type of the plurality of second ion regions 230b is the second conductivity type corresponding to the drift region 214. In another embodiment, the conductivity type of the plurality of first ion regions 230a is the second conductivity type and the conductivity type of the plurality of second ion regions 230b is the first conductivity type.

Figure 5D:
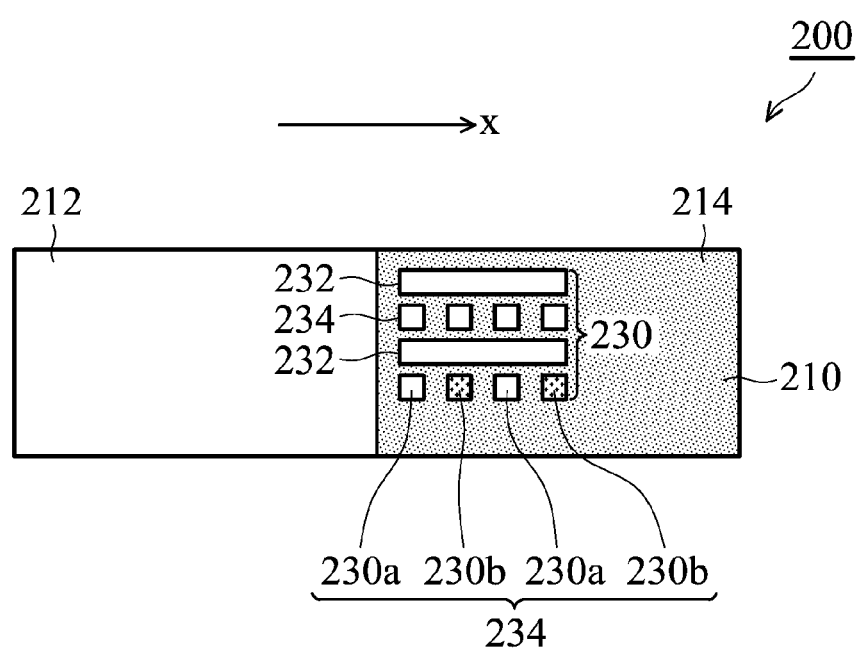

Referring to FIG. 5d, a cross-sectional view of the RESURF structure 230 is illustrated in accordance with a further exemplary embodiment of the present disclosure. The RESURF structure 230 is a multi-layered structure formed by alternating first ion layers 232 and second ion layers 234. The first ion layers 232 are formed of the plurality of first ion regions 230a. In another embodiment, the first ion layers 232 may be formed of the plurality of second ion regions 230b. The plurality of second ion layers 234 are composed of regions by alternating the plurality of first ion regions 230a and the plurality of second ion regions 230b in the first lateral direction x. The conductivity types of the first and the second ion regions 230a and 230b are different from each other. In the embodiment, the conductivity type of the plurality of first ion regions 230a is the first conductivity type corresponding to the body region 212 and the conductivity type of the plurality of second ion regions 230b is the second conductivity type corresponding to the drift region 214. In yet another embodiment, the conductivity type of the plurality of first ion regions 230a is the second conductivity type and the conductivity type of the plurality of second ion regions 230b is the first conductivity type.

Figure 5E:
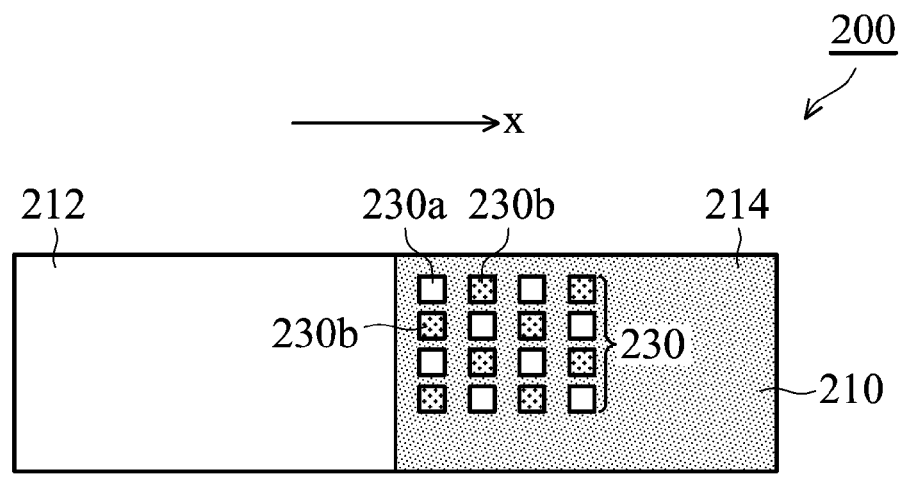

In an embodiments, RESURF structure 230 is a multi-layered structure formed by alternating the plurality of first ion regions 230a and the plurality of second ion regions 230b in the lateral direction x as well as a vertical direction, as shown in FIG. 5e. The conductivity types of the first and the second ion regions 230a and 230b are different from each other. In the embodiment, the conductivity type of the plurality of first ion regions 230a is the first conductivity type corresponding to the body region 212 and the conductivity type of the plurality of second ion regions 230b is the second conductivity type corresponding to the drift region 214. In another embodiment, the conductivity type of the plurality of first ion regions 230a is the second conductivity type and the conductivity type of the plurality of second ion regions 230b is the first conductivity type.

Figure 5F:
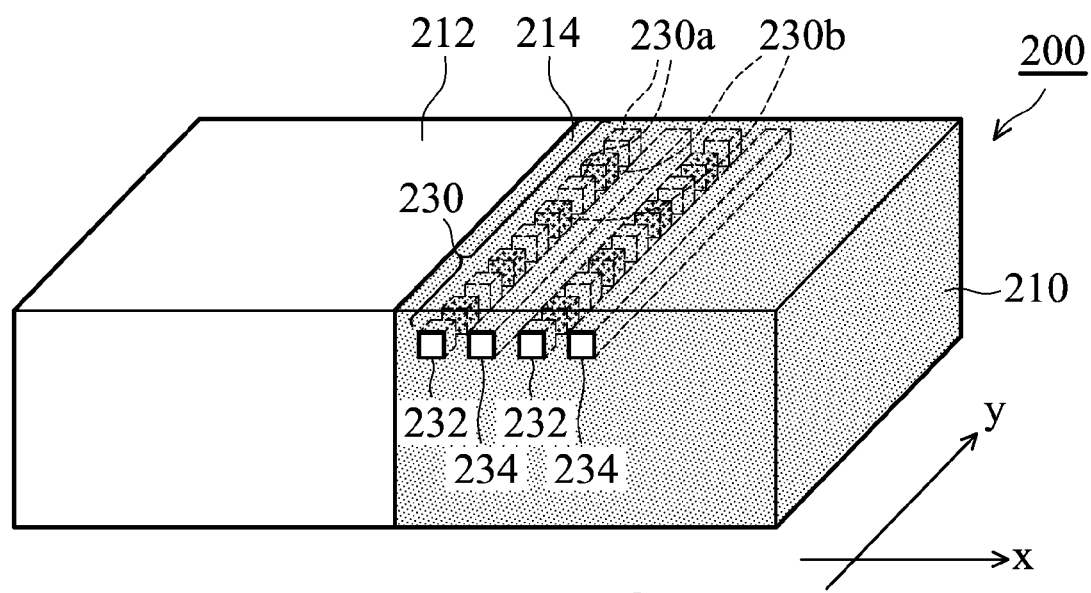

Referring to FIG. 5f, a 3-dimensional perspective of the RESURF structure 230 is illustrated in accordance with an exemplary embodiment of the present disclosure. The RESURF structure 230 is a multi-layered structure formed by alternating first ion layers 232 and second ion layers 234 in the first lateral direction x. The first ion layers 232 are composed of regions formed by alternating the plurality of first ion regions 230a and the plurality of second ion regions 230b in the second lateral direction y. The plurality of second ion layers 234 are formed by implanting the plurality of first ion regions 230a. In another embodiment, the plurality of second ion layers may be formed of the plurality of second ion regions 230b. The conductivity types of the first and the second ion regions 230a and 230b are different from each other. In the embodiment, the conductivity type of the plurality of first ion regions 230a is the first conductivity type corresponding to the body region 212 and the conductivity type of the plurality of second ion regions 230b is the second conductivity type corresponding to the drift region 214. In yet another embodiment, the conductivity type of the plurality of first ion regions 230a is the second conductivity type and the conductivity type of the plurality of second ion regions 230b is the first conductivity type.

Figure 5G:
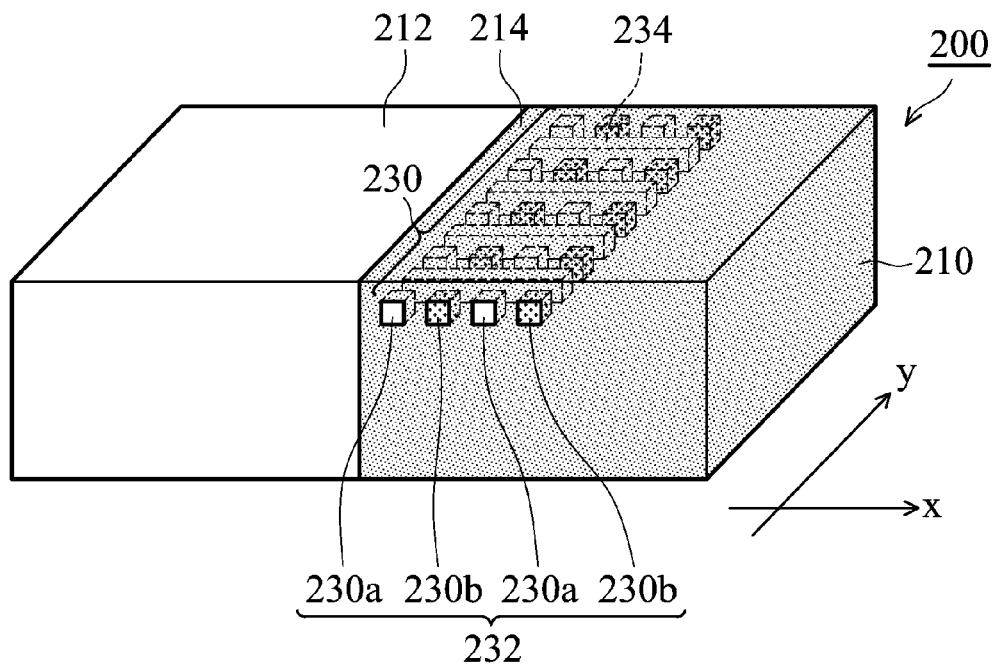

FIG. 5g shows a 3-dimensional perspective view of the RESURF structure 230 in accordance with an exemplary embodiment of the present disclosure. The RESURF structure 230 is a multi-layered structure formed by alternating first ion layers 232 and second ion layers 234 in the second lateral direction y. The first ion layers 232 are composed of regions formed by alternating the plurality of first ion regions 230a and the plurality of second ion regions 230b in the first lateral direction x. The plurality of second ion layers 234 are formed of the plurality of first ion regions 230a. In another embodiment, the plurality of second ion layers 234 are formed of the plurality of second ion regions 230b. The conductivity types of the first and the second ion regions 230a and 230b are different from each other. In the embodiment, the conductivity type of the plurality of first ion regions 230a is the first conductivity type corresponding to the body region 212 and the conductivity type of the plurality of second ion regions 230b is the second conductivity type corresponding to the drift region 214. In yet another embodiment, the conductivity type of the plurality of first ion regions 230a is the second conductivity type and the conductivity type of the plurality of second ion regions 230b is the first conductivity type.

Figure 5H:
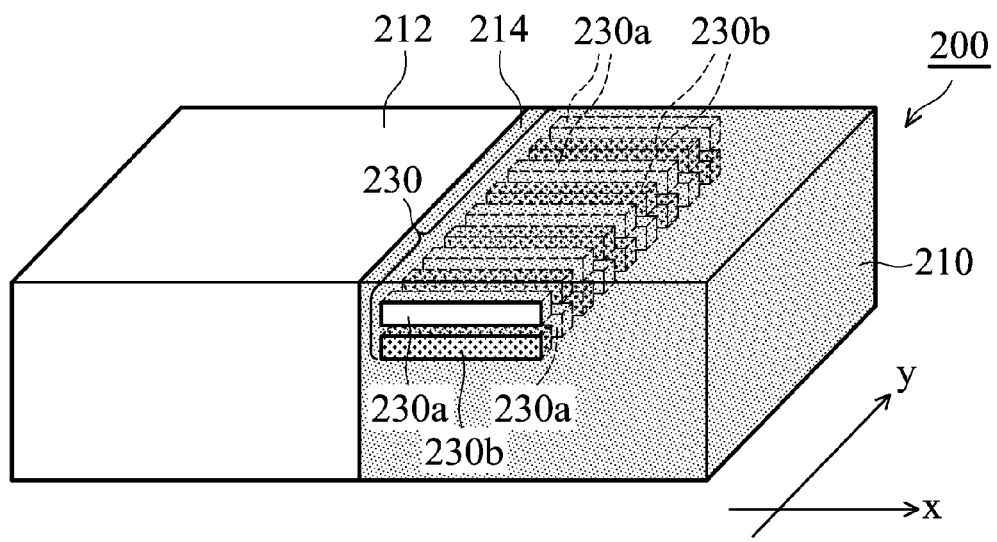

In an embodiment, RESURF structure 230 is a structure formed by alternating the plurality of first ion regions 230a and the plurality of second ion regions 230b in the lateral direction y as well as a vertical direction, as shown in FIG. 5h. The conductivity types of the first and the second ion regions 230a and 230b are different from each other. In the embodiment, the conductivity type of the plurality of first ion regions 230a is the first conductivity type corresponding to the body region 212 and the conductivity type of the plurality of second ion regions 230b is the second conductivity type corresponding to the drift region 214. In another embodiment, the conductivity type of the plurality of first ion regions 230a is the second conductivity type and the conductivity type of the plurality of second ion regions 230b is the first conductivity type.

Although various configurations of the multiple RESURF structure 230 in accordance with embodiments are discussed, it should be understood, however, that the present invention is not limited to the configurations shown in FIGS. 5a-5h. To the contrary, it is intended to cover various modifications and similar arrangements. For example, the number of the ion regions or layers of the multiple RESURF structure may be more or less than that of the RESURF structures 230 shown in FIGS. 5a-5h and the thickness or size of each ion regions or layers of the multiple RESURF structure may be various as long as a shorter current path from the source region to the drain region is provided. Additionally, the multiple RESURF structures of FIGS. 5a-5h may also be formed in the drift region 224 of the epitaxial layer as shown in FIG. 3b.

A gate dielectric structure 280 with a step formed on the edge thereof will be discussed in accordance to embodiments of the present disclosure.

FIGS. 6a-6d illustrate a step-to-step procedure for forming the step gate dielectric structure 280 in accordance with an exemplary embodiment.

Figure 6A:
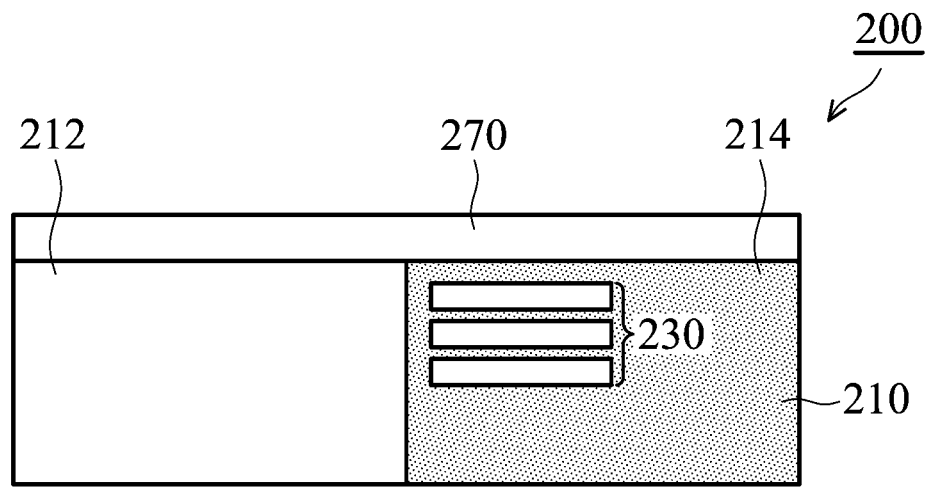
FIGS. 6a-6d illustrate a method for forming the step gate dielectric structure in accordance with an exemplary embodiment.

Referring to FIG. 6a, a first gate dielectric layer 270 is formed on the semiconductor substrate 210 (or the epitaxial layer 220 if exists). The first gate dielectric layer 270 comprises silicon oxide, silicon nitride, silicon oxynitride, high-k dielectrics, other suitable dielectric materials, or combinations thereof. High-k dielectrics may comprise metal oxides, for example, oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The first gate dielectric layer 270 may be formed by an ordinary process known in the art, such as atomic layer deposition (ALD), chemical vapor deposition (CVD), physical vapor deposition (PVD), thermal oxidation, UV-ozone oxidation, or combinations thereof. The first gate dielectric layer 270 may have a thickness from about 400 angstroms to 5000 angstroms. The gate dielectric layer 270 may cover both of the body region 212 and the drift region 214 (or 222 and 224).

Figure 6B:
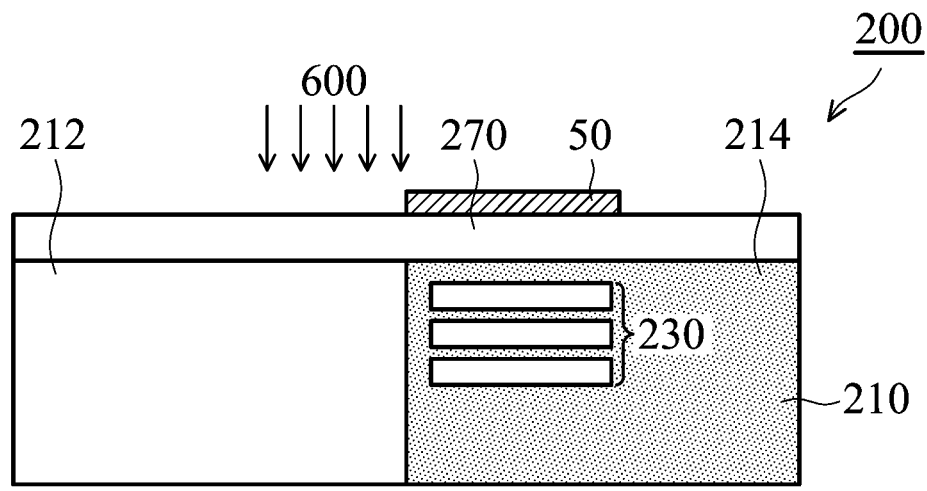
Figure 6C:
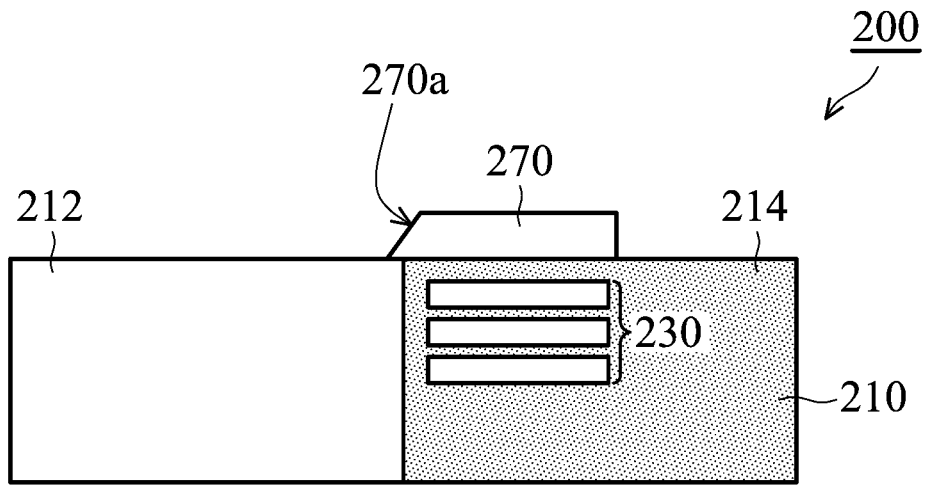

Referring to FIG. 6b, an etching process 600 is performed to remove a portion of the first gate dielectric layer 270 using a mask layer 50 to form a step 270a on at least one edge of the first gate dielectric layer 270 (as shown in FIG. 6c). The mask layer 50 may be a patterned photoresist layer or a hard mask layer such as a silicon nitride or a silicon oxynitride layer or the like. The etching process 600 may be a dry etching process or a wet etching process. Although the step 270a shown in FIG. 6c is in a cliff-shape, it should be realized that the step 270a may also be in a rounded-shape or any other suitable shapes. The mask layer 42 is then removed after the step is formed on the edge of the first gate dielectric layer 270.

Figure 6D:
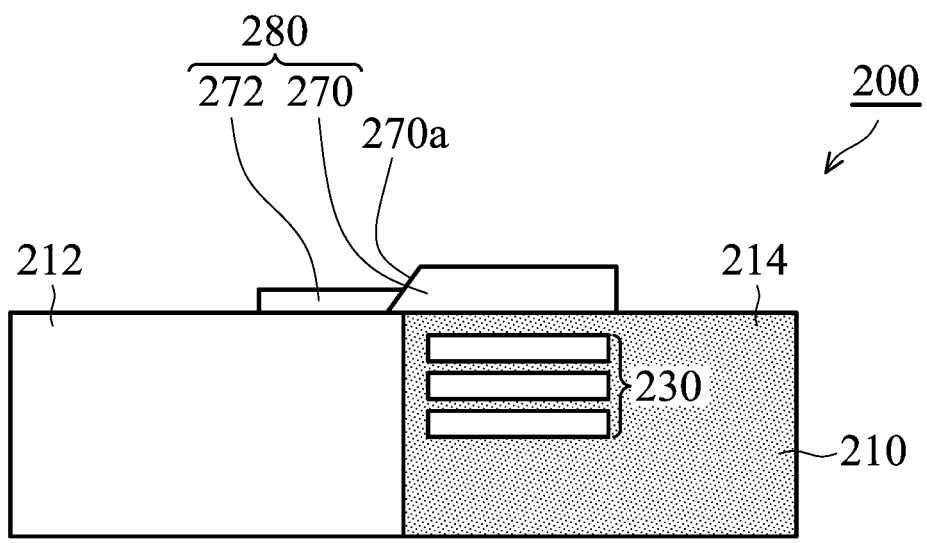

Referring to FIG. 6d, a second gate dielectric layer 272 having a thickness thinner than the thickness of the first gate dielectric layer 270 is formed on the semiconductor substrate 210 (or the epitaxial layer 220 if exists). The first gate dielectric layer 270 and the second gate dielectric layer 272 are associated together form the step gate dielectric structure 280. The second gate dielectric layer 272 adjoins the step 270a of the first gate dielectric 270. The thickness of the second gate dielectric layer 272 is about 30 angstroms to 1000 angstroms. The same processes for forming the first gate dielectric layer 270 may be used to form the second gate dielectric layer, for example, atomic layer deposition (ALD), chemical vapor deposition (CVD), physical vapor deposition (PVD), thermal oxidation, UV-ozone oxidation, or combinations thereof. The second gate dielectric layer 272 may be formed of a material similar to the first gate dielectric layer 270, for example, silicon oxide, silicon nitride, silicon oxynitride, high-k dielectrics, other suitable dielectric materials, or combinations thereof.

FIGS. 7a-7d illustrate a step-to-step procedure for forming the step gate dielectric structure 280 in accordance with another exemplary embodiment.

Figure 7A:
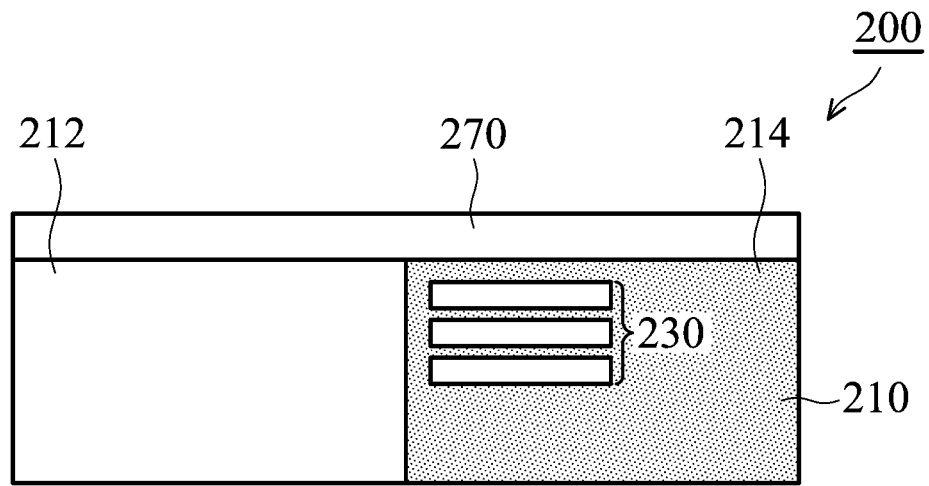
FIGS. 7a-7d illustrate a method for forming the step gate dielectric structure in accordance with another exemplary embodiment.

Referring to FIG. 7a, first gate dielectric layer 270 is formed on the semiconductor substrate 210 (or the epitaxial layer 220 if exists). The first gate dielectric layer 270 comprises silicon oxide, silicon nitride, silicon oxynitride, high-k dielectrics, other suitable dielectric materials, or combinations thereof. High-k dielectrics may comprise metal oxides, for example, oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The first gate dielectric layer 270 may be formed by an ordinary process known in the art, such as Local Oxidation of Silicon (LOCOS), other depositions (for example, atomic layer deposition (ALD), chemical vapor deposition (CVD), physical vapor deposition (PVD), thermal oxidation, UV-ozone oxidation), or combinations thereof. The gate dielectric layer 270 may cover both of the body region 212 and the drift region 214 (or 222 and 224).

Figure 7B:
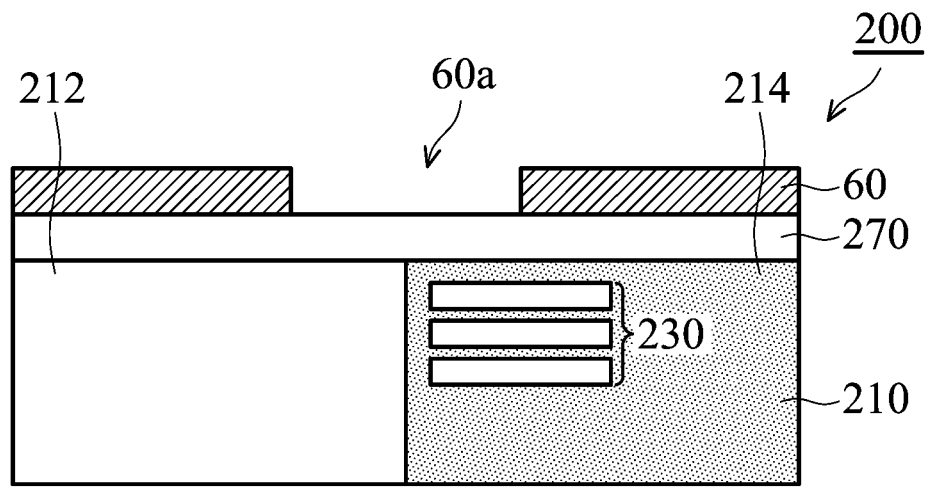

Referring to FIG. 7b, a mask layer 60 with at least one opening 60a is formed on the first gate dielectric layer 270 to selectively expose a portion of the first gate dielectric layer 270. The opening 60a may be formed by an etching process.

Figure 7C:
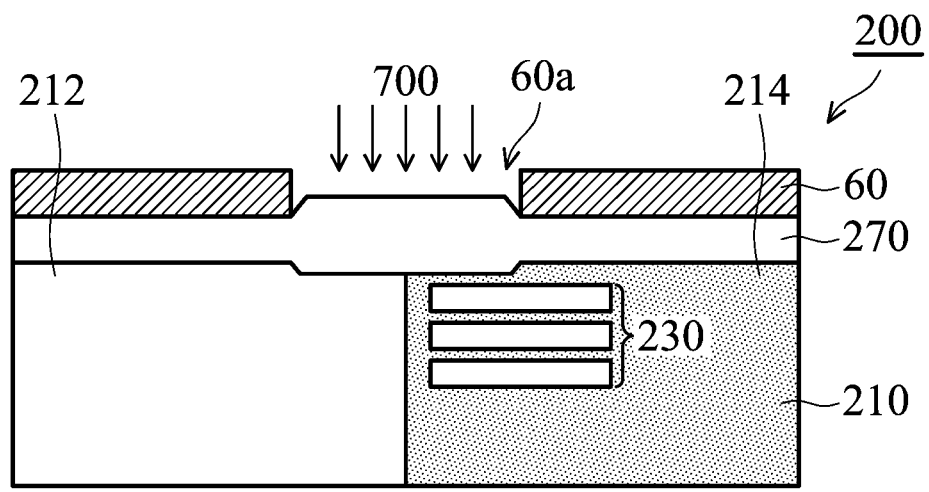

Referring to FIG. 7c, a thermal growth process 700 is applied to the exposed portion of the first gate dielectric layer 270 in the opening 60a. The portion of first gate dielectric layer 270, where the thermal growth process 700 applied to, expands to a greater thickness. In some embodiments, a second thermal growth process may be optionally performed to develop a further expansion of the first gate dielectric layer 270. The expanded portion the first gate dielectric layer 270 may have aa thickness of about _____-_____. In some embodiments, a portion of the first gate dielectric layer 270 expands into the substrate 210 (or the epitaxial layer 220 if exists), as shown as FIG. 7c.

Figure 7D:
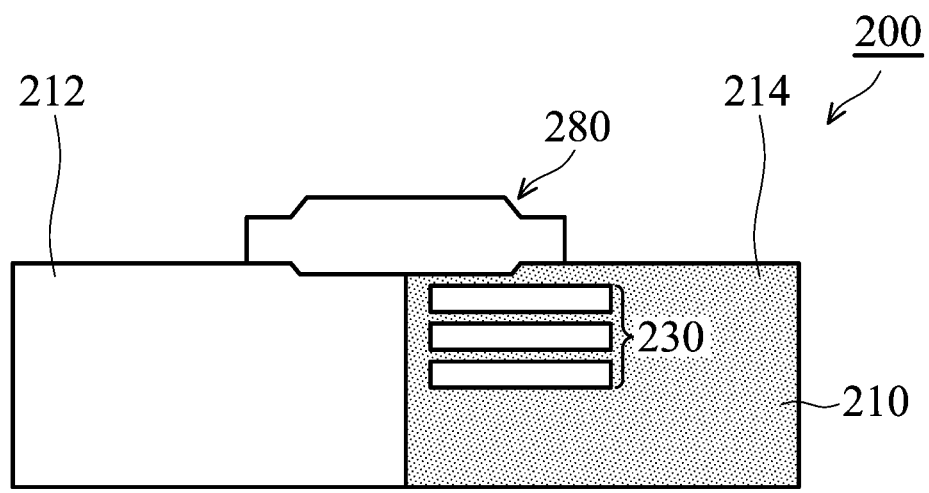

Referring to FIG. 7d, the mask layer 60 and a portion of the first gate dielectric layer 270 are removed to form a step gate dielectric structure 280.

Figure 8:
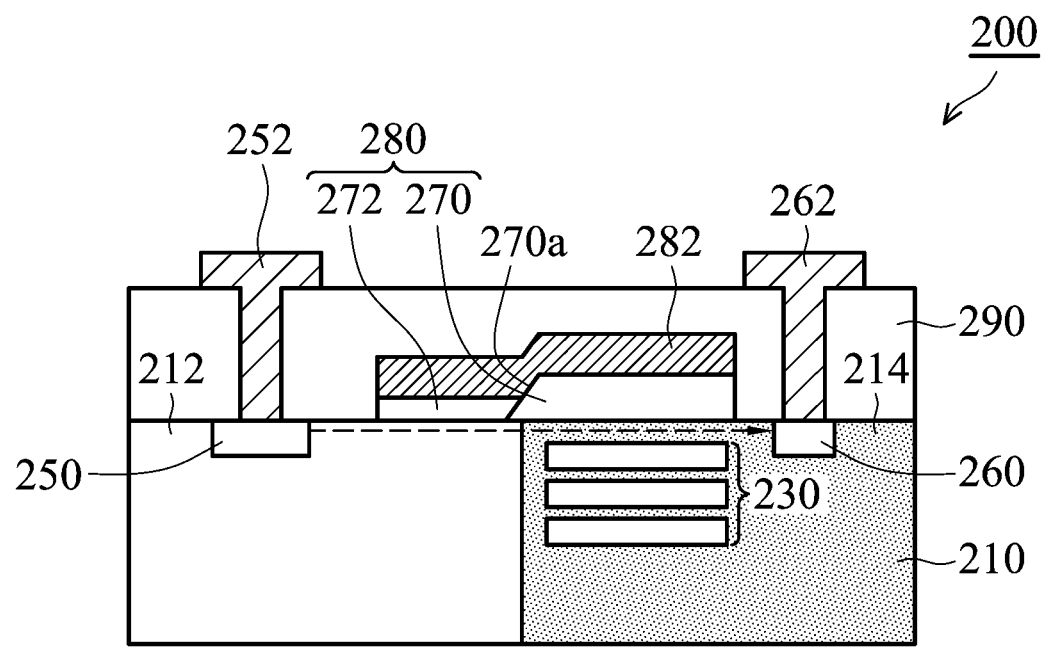
FIG. 8 illustrate a LDMOS device having a multiple RESURF structure and a step gate dielectric structure in accordance with an exemplary embodiment of the present disclosure.

After the step gate dielectric structure is formed. A process for forming source and drain regions is performed. Referring to FIG. 8, a source region 250 is formed in the body region 222 and a drain region 260 is formed. The source and drain regions 250 and 260 may be formed by a doping process commonly used in the art, such as an ion implantation process.

Features that are commonly found in a conventional semiconductor device such as an inter-layer dielectric (ILD) layer 290, source/drain electrodes 252 and 262, and a gate electrode 282 are formed to complete the formation of the semiconductor device 200. Referring to FIG. 5e, the interlayer dielectric (ILD) layer 290 may be formed covering the semiconductor device 200 with contact holes exposing the source/drain regions 250 and 260. It is noted that depending on the design of a device, the number of the contact hole may be two or more. The gate electrode 282 may include a single layer or multilayer structure formed on the gate dielectric structure 280. The gate electrode 282 may be formed of a material comprises metal, doped polysilicon, or combination thereof. The gate electrode 282 may be formed using a process such as low-pressure chemical vapor deposition (LPCVD), plasma enhanced chemical vapor deposition (PECVD), other suitable processes, or combinations thereof. The source electrode 252 is formed on the source region 250 and the drain electrode 262 is formed on the drain region 260.

The disclosed embodiments provide at least the following advantages over the conventional LDMOS device. First, step gate dielectric structure 280 provides a shorter path (as shown as the dotted line in FIG. 8) for the current to flow from the source region 250 to the drain region 260, which may lead to a low on-resistance ($R_{on}$) of the semiconductor device 200. Second, due the design of multiple RESURF structure 230, the breakdown voltage level may be maintained while reducing the on-resistance of the semiconductor device 200.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
    a substrate having a first conductivity type, comprising:
        a body region having the first conductivity type;
        a source region formed in the body region;
        a drift region having a second conductivity type adjacent to the body region; and
        a drain region formed in the drift region;
    a multiple reduced surface field (RESURF) structure embedded in the drift region of the substrate, wherein the multiple RESURF structure is a multi-layered structure consisting of a plurality of first ion regions having the first conductivity type and a plurality of second ion regions having the second conductivity type, wherein the plurality of first ion regions and the plurality of second ion regions are spaced apart from each other, wherein the plurality of second ion regions has a higher doping concentration than the drift region; and
    a gate dielectric layer formed over the substrate;

wherein the first conductivity type is opposite to the second conductivity type.

2. The semiconductor device of claim 1, wherein the first ion region and the second ion region are configured alternately in a vertical direction.

3. The semiconductor device of claim 1, wherein the multiple RESURF structure is a multi-layered structure formed by alternating p-type and n-type ions in a lateral direction.

4. The semiconductor device of claim 1, wherein the multiple RESURF structure is a multi-layered structure formed by alternating p-type and n-type ions in a lateral and vertical direction.

5. The semiconductor device of claim 1, wherein the multiple RESURF structure is formed between the source region and the drain region.

6. The semiconductor device of claim 1, wherein the gate dielectric layer comprises a step or a curved shape on at least one edge thereof.

7. The semiconductor device of claim 1, wherein a portion of the gate dielectric layer extends from a top surface of the substrate into the substrate.

8. The semiconductor device of claim 1, wherein the first conductivity type is n-type and the second conductivity type is p-type.

9. The semiconductor device of claim 1, wherein the first conductivity type is p-type and the second conductivity type is n-type.

10. The semiconductor device of claim 1, further comprising a source electrode formed on the source region and a drain electrode formed on the drain region.

11. The semiconductor device of claim 1, wherein the body and drift regions are formed in an epitaxial layer of the substrate and the gate dielectric layer is formed over the epitaxial layer of the substrate.

12. A method for fabricating the semiconductor device of claim 1, comprising:
    providing a semiconductor substrate of a first conductivity type;
    implanting a dopant of a first conductivity type into the substrate to define a body region;
    implanting a dopant of a second conductivity type, into the substrate to define a drift region adjacent to the body region;
    forming a multiple reduced surface field (RESURF) structure in the drift region, wherein the multiple RESURF structure is a multi-layered structure consisting of a plurality of first ion regions having the first conductivity type and a plurality of second ion regions having the second conductivity type, wherein the plurality of first ion regions and the plurality of second ion regions are spaced apart from each other, wherein the plurality of second ion regions has a higher doping concentration than the drift region;
    forming a gate dielectric layer over the substrate;
    forming a source region in the body region; and
    forming a drain region in the drift region;
    wherein the first conductivity type is opposite to the second conductivity type.

13. The method of claim 12, wherein the multiple RESURF structure is formed by implanting ions into the drift region.

14. The method of claim 13, wherein the first ion region and the second ion region are configured alternately in a vertical direction.

15. The method of claim 13, wherein the multiple RESURF structure is a multi-layered structure formed by alternating p-type and n-type ions in a lateral direction.

16. The method of claim 13, wherein the multiple RESURF structure is a multi-layered structure formed by alternating p-type and n-type ions in a lateral and vertical direction.

17. The method of claim 12, wherein the multiple RESURF structure is formed between the source region and the drain region.

18. The method of claim 12, wherein the step for forming the gate dielectric layer comprises:
    forming a first gate dielectric layer over the substrate;
    forming a patterned mask on the first gate dielectric layer to define a step area of the first gate dielectric layer;
    removing a portion of the first gate dielectric layer by a dry or a wet etching process to form a step or a curved shape on at least one edge of the first gate dielectric layer;
    removing the patterned mask; and
    forming a second gate dielectric layer over the substrate and adjoining the first gate dielectric layer;
    wherein the second gate dielectric layer is thinner than the first gate dielectric layer, and the second gate dielectric layer and the first gate dielectric layer associate together to form the gate dielectric layer.

19. The method of claim 12, wherein the step for forming the gate dielectric layer comprises:
    forming gate dielectric layer over the substrate;
    forming a patterned mask with an opening over the gate dielectric layer;
    applying a thermal growth process to a portion of the gate dielectric layer in the opening, wherein the portion of the gate dielectric layer expands to a greater thickness, and wherein the portion of the gate dielectric layer extends from the surface of the substrate into the substrate; and
    removing the patterned mask.

20. The method of claim 12, wherein the gate oxide layer comprises silicon oxide, nitrogen oxide, carbon oxide, silicon oxynitride, or combinations thereof.

21. The method of claim 12, wherein the first conductivity type is n-type and the second conductivity type is p-type.

22. The method of claim 12, wherein the first conductivity type is p-type and the second conductivity type is n-type.

23. The method of claim 12, further comprising:
    forming a source electrode on the source region of the body region;
    forming a drain electrode on the drain region of the drift region; and
    forming a gate electrode on the gate dielectric layer, wherein the gate electrode electrically couples to the source electrode and the drain electrode.

24. The method of claim 12, wherein the body and drift regions are formed in an epitaxial layer of the substrate and the gate dielectric layer is formed over the epitaxial layer of the substrate.

* * * * *